United States Patent [19]

Lee

[11] Patent Number: 5,846,880
[45] Date of Patent: Dec. 8, 1998

[54] PROCESS FOR REMOVING TITANIUM NITRIDE LAYER IN AN INTEGRATED CIRCUIT

[75] Inventor: Ching-Ying Lee, Hsin Chu, Taiwan

[73] Assignee: Vanguard International Semiconductor Corporation, Hsin-Chu, Taiwan

[21] Appl. No.: 690,302

[22] Filed: May 16, 1996

Related U.S. Application Data

[63] Continuation of Ser. No. 430,469, Apr. 28, 1995, abandoned.

[51] Int. Cl.$^6$ .................................................. H01L 21/44
[52] U.S. Cl. ........................ 438/669; 438/720; 438/738; 438/648; 438/637
[58] Field of Search ..................................... 438/720, 648, 438/626, 631, 688, 694, 697, 706, 712, 669, 738, 754, 725, 636, 637

[56] References Cited

U.S. PATENT DOCUMENTS

| | | | |
|---|---|---|---|
| 4,605,470 | 8/1986 | Gwozdz et al. . | |
| 4,820,611 | 4/1989 | Arnold, III et al. . | |
| 4,824,521 | 4/1989 | Kulkarni et al. . | |
| 4,839,311 | 6/1989 | Riley et al. . | |
| 4,946,550 | 8/1990 | Van Laarhoven | 156/643 |
| 4,946,804 | 8/1990 | Pritchard et al. | 437/228 |
| 4,948,459 | 8/1990 | Van Laarhoven et al. | 156/643 |
| 5,086,017 | 2/1992 | Lu | 437/200 |
| 5,627,345 | 5/1997 | Yamamoto et al. | 174/265 |

OTHER PUBLICATIONS

Haim Gilboa, et al. "Sequential Sputter Deposition of Titanium Nitride and Aluminum" Proc. Seventh International IEEE VLSI Multilevel Int. Conf. (Jun. 1990).

*Primary Examiner*—Caridad Everhart
*Attorney, Agent, or Firm*—George O. Saile; Stephen B. Ackerman

[57] ABSTRACT

A process has been developed for removing an anti-reflective coating of titanium nitride from the surface of an aluminum layer that has been covered by a dielectric layer. Previously, this was achieved by coating said titanium nitride layer (together with the aluminum layer) with the dielectric layer and then using a single etching process to form both via holes through the dielectric and to remove the titanium nitride. When this process is used, etching proceeds reasonably quickly through the dielectric layer but becomes extremely slow once the titanium nitride is reached. In the process of the present invention, the titanium nitride layer is rapidly removed (prior to application of the dielectric layer) using a more powerful etchant. The titanium nitride/titanium layer that underlies the aluminum layer is protected during this rapid etching phase by means of a layer of a spin-on glass.

16 Claims, 3 Drawing Sheets

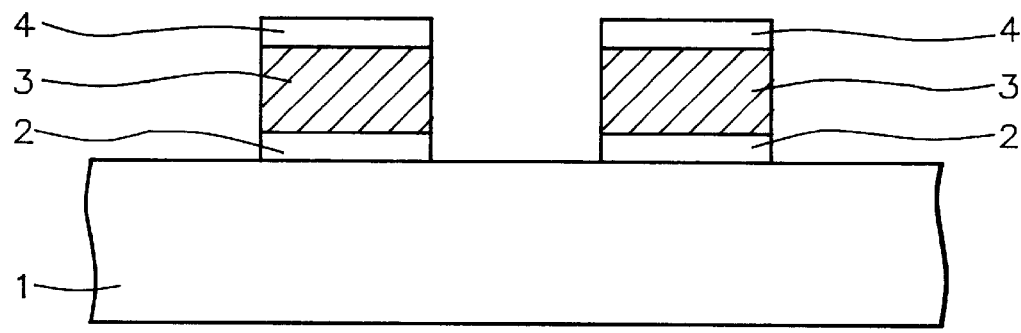
*FIG. 1*
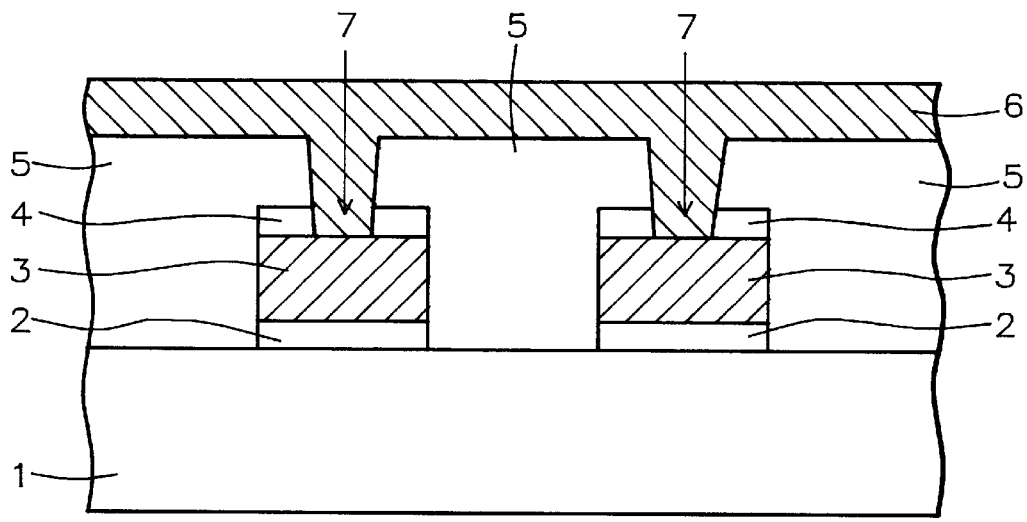
*FIG. 2 - Prior Art*

5,846,880

PROCESS FOR REMOVING TITANIUM NITRIDE LAYER IN AN INTEGRATED CIRCUIT

This is a continuation of application Ser. No. 08/430,469, filed Apr. 28, 1995, now abandoned.

BACKGROUND OF THE INVENTION (1) Field of the Invention

The invention relates to the general field of silicon integrated circuits, more particularly to the etching of titanium nitride films.

(2) Description of the Prior Art

As part of the manufacturing process for silicon integrated circuits, it is often necessary to provide electrically conductive lines that are relatively thick (thereby minimizing their resistance). Such lines typically, though not exclusively, comprise aluminum. In order to form them, a layer of aluminum is first deposited over the surface of the entire integrated circuit and then etched, under a suitable photoresist mask, to form lines.

In general, the surface over which the aluminum film is deposited is not planar but, rather, includes multiple steps that were produced earlier in the manufacturing process. Photoresist, deposited over a non-planar surface, tends to be thicker in the valleys and thinner on the crests. This can introduce problems during exposure of the photoresist to ultraviolet light since the optimum dosage of the ultraviolet light varies with the thickness of the photoresist layer. Furthermore, standing wave effects are possible during exposure of the thinner photoresist layers as a consequence of ultraviolet light being reflected from the surface of the aluminum layer and then interfering with the incoming ultraviolet light.

Such a standing wave effect during photoresist exposure is highly undesireable since it introduces planes of high exposure, interspersed with planes of low exposure, within the photoresist layer, therby undermining its integrity. One method for minimizing standing wave effects is to provide an anti-reflective coating (ARC) on the surface that is to receive the layer of photoresist. While a number of ARCs such as titanium/tungsten are available, our preferred material for ARCs has been titanium nitride.

After the aluminum layer, including its ARC of titanium nitride, has been etched, it would normally be coated with a dielectric layer whose purpose is to serve as an inter-metal-dielectric (IMD) upon whose surface a second layer of a metallic conductor may be deposited and then formed into lines.

Prior to the deposition of said second conductive layer it is necessary to etch via holes through the IMD down to the level of the aluminum, or first conductive layer, wherever electrical contact between the two metallic layers will be required. The etchant selected in this situation is one that will etch through the IMD and then continue to etch through the titanium nitride layer, without, at the same time, significantly undercutting the IMD layer or attacking the aluminum layer. The etchant typically comprises a mix of $CF_4$ and $CHF_3$ gases in argon at a pressure of about 0.3 torr and temperature of 0° C. for about 3 minutes.

These etch conditions are relatively mild and are well suited for etching through a typical IMD layer such as silicon dioxide but are less than optimum for etching titanium nitride, resulting in very low etch rates for this material. Under conditions where the IMD was etched at a rate of 6,000 Angstrom units per minute the etch rate for the titanium nitride layer was only 500 Angstrom units per minute. This introduced significant delay into the production line, effectively increasing the cost of the end product.

An additional problem associated with this approach to removing the titanium nitride is the tendency for a thin layer of polymer to form on the vertical walls of the via holes. Said polymer layer is produced through interaction of some of the photoresist and the titanium nitride with the etchant gas. Thus a method, compatible with the rest of the process, for rapidly removing the titanium nitride layer was needed as well as a way to eliminate the formation of the polymer layer on the inside walls of the via holes.

SUMMARY OF THE INVENTION

It is an object of the present invention to provide a process for removing a titanium nitride layer, that lies between an aluminum layer and a dielectric layer, without undercutting the remaining titanium nitride or attacking the aluminum.

A further object of the present invention is that said process for removing titanium nitride should not, as a side-effect, result in the deposition of a layer of polymer.

Yet another object of the invention is that said process for removing titanium nitride be significantly faster than previous processes used to achieve the same end.

These objects have been achieved by the process of the present invention wherein the titanium nitride layer is rapidly removed (prior to application of the dielectric layer) using a powerful etchant. The aluminum layer is protected during this rapid etching phase by means of a layer of a spin-on glass. Following the removal of the titanium nitride, the dielectric layer is applied and via holes are etched in it.

BRIEF DESCRIPTION OF THE DRAWINGS

FIG. 1 is a schematic cross-section through a partially completed integrated circuit.

FIG. 2 shows connections between two layers of metal wiring as practised in the prior art.

DESCRIPTION OF THE PREFERRED EMBODIMENTS

Figure 3:
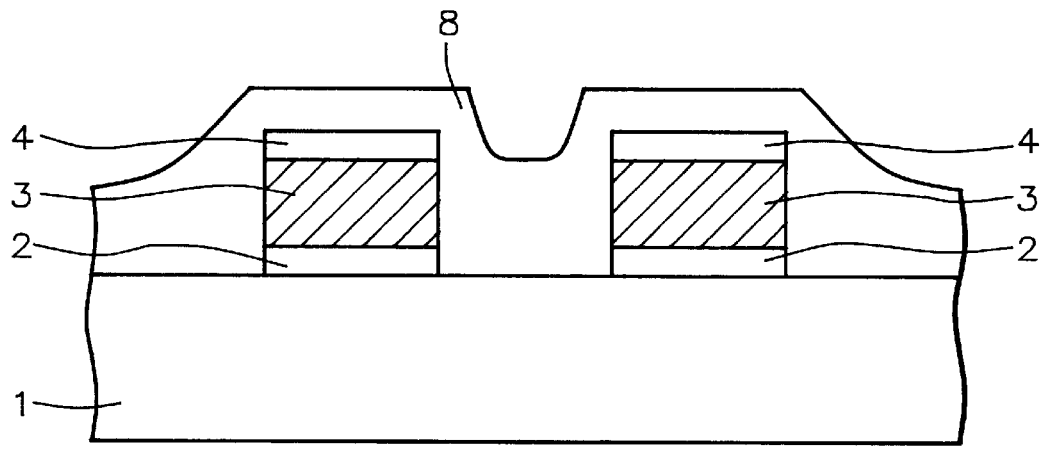
FIG. 3 shows two aluminum lines on the surface of the integrated circuit covered by a layer of spin-on glass.

Referring now to FIG. 1, we show, in schematic cross-section, a portion of a partially completed integrated circuit 1 upon whose surface aluminum conductors 3 have been deposited. Said conductors lie on the surface of integrated circuit 1 and are in the form of lines seen end-on in the figure. Interface layer 2, comprises a barrier layer of titanium nitride. It is about 1,500 Angstrom units thick and lies between aluminum layer 3 and the surface of integrated circuit 1 to prevent spiking (uneven diffusion of aluminum into the silicon). A thin layer of titanium about 300 Angstrom units thick (not shown in the figure) is present between layer 2 and the surface of 1 for the purpose of minimizing contact resistance.

Layer 4 comprises titanium nitride. Typical thickness for layer 4 is from about 200 to about 500 Angstrom units. The purpose of layer 4 was to act as an anti-reflective coating during the exposure of the photoresist layer that was used to mask the aluminum layer prior to etching it into lines.

Referring now to FIG. 2, lines 3 serve as a first level of metal wiring for the integrated circuit. In general this is insufficient and a second level of metal wiring 6 is required. The wires represented by 6 should be visualized as running at right angles to the wires represented by 3. To separate these two levels of wiring an inter-metal dielectric (IMD) layer 5 is provided. For IMD 5 we have preferred to use a spin-on glass (SOG) layer, sandwiched between two layers of silicon oxide, because, in addition to serving as a dielectric layer it also tends to planarize the surface of the integrated circuit.

After the formation of layer 5, via holes 7 had to be etched through it down to the level of lines 3 so that electrical contact could be made between the two levels of metallic wiring, wherever this was required. A single etching process was preferred which could remove material from both layers 4 and 5 in one step, in a smooth and continuous manner. Said process was to use a mix of $CF_4$ and $CHF_3$ gases in argon at a pressure of about 0.3 torr and temperature of 0° C. for about 3 minutes. When using this process, the etch rates for layers 4 and 5 were found to be significantly different. Layer 4 (comprising titanium nitride) was found to etch at a rate of about 500 Angstrom units per minute whereas layer 5 (comprising SOG sandwiched between two layers of silicon oxide) was found to etch at a rate of about 6,000 Angstrom units per minute. The relatively long time required for the etching of layer 4 (typically about a minute) introduced undesireable delays into the production line so an alternative process, which constitutes the present invention, was developed.

Referring now to FIG. 3, a layer of SOG 8 has been deposited onto the structure that was illustrated in FIG. 1. We have preferred to use Allied Signal Siloxane type 211 SOG but other SOGs, such as Siloxane types 311 or 314, could also be used, as well as any of several Silicate types of SOG. Layer 8 was formed by spin coating followed by baking and curing in nitrogen. Unlike IMD 5 (in FIG. 2), however, the purpose of the IMD is to facilitate the patterning of metal 2, the SOG coating being the key step of the IMD process for planarization. Following its deposition, layer 8 is etched back by means of Reactive Ion Etching in an Applied Materials PR500 etch chamber using a mix of $F_2$, $CF_4$, and $CHF_3$ gases, for just long enough for the surface of titanium nitride layer 4 to become fully exposed, while still leaving a layer of SOG in place to prevent any undercutting of layer 2.

Figure 4:
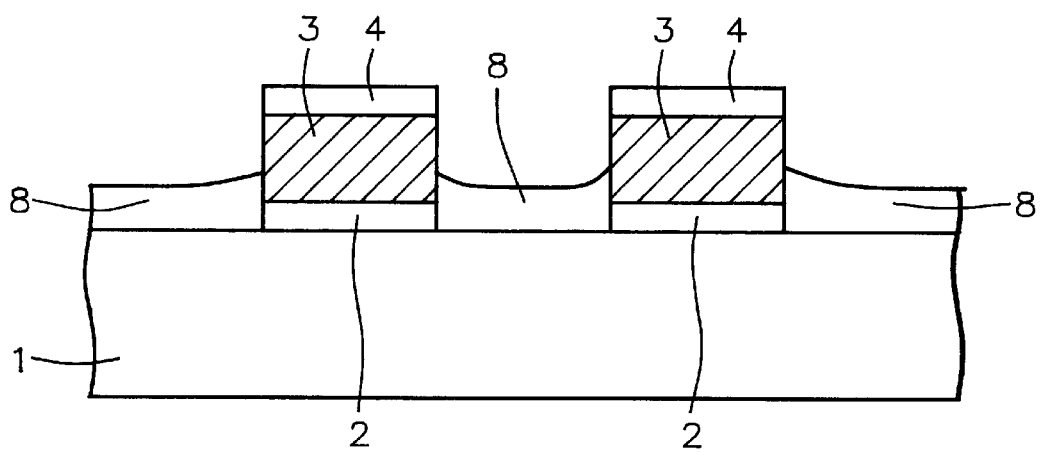
FIG. 4 is FIG. 3 after etching back the spin-on glass layer to expose the titanium nitride layer that covers the aluminum lines.

The structure now has the appearance illustrated in FIG. 4. The surface of titanium nitride layer 4 has been fully exposed while SOG layer 8 has been etched back as shown. It now becomes possible to use a significantly more powerful etching process for the removal of layer 4. We have found that a mix of carbon tetrafluoride, oxygen, and nitrogen at a pressure in the range of from about 1.5 to about 4 torr at a temperature in the range of from about 250° to about 450° C. will fully remove titanium nitride layer 4 in from 0.3 to 0.5 minutes, without attacking aluminum lines 3.

Figure 5:
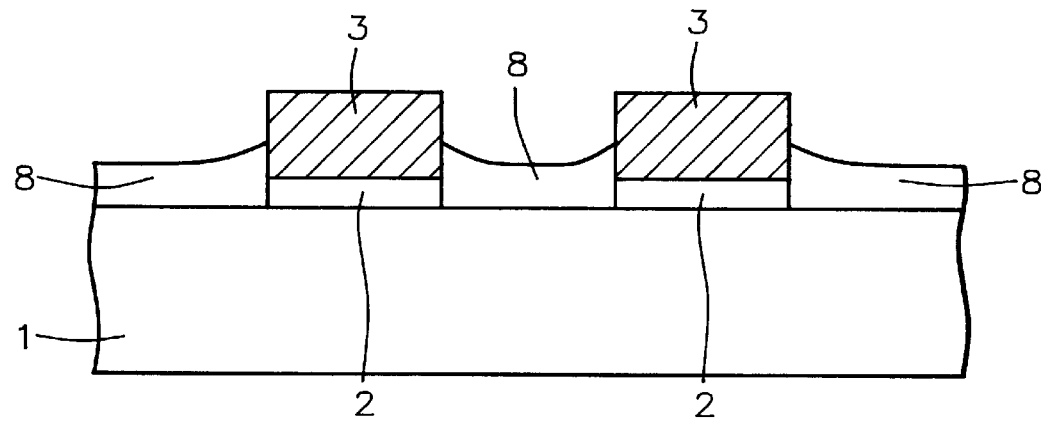
FIG. 5 is FIG. 4 after said titanium nitride layer has been removed.

At this stage in the process the structure has the appearance illustrated in FIG. 5. With the complete removal of the titanium nitride layer, the surface of aluminum lines 3 is now in a suitable state for making low resistance contact to the second level of metallic wiring, where required. In addition, since there was no layer of photoresist present while the titanium nitride layer was being removed, the polymer layer, previously mentioned as a byproduct of chemical reaction between the titanium nitride and the photoresist, cannot form.

Figure 6:
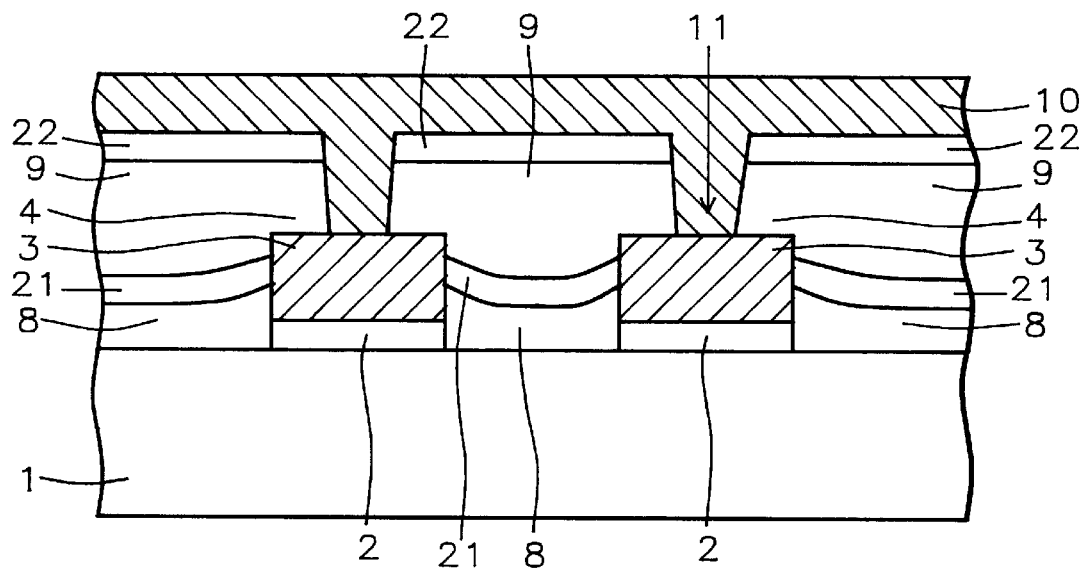
FIG. 6 shows connections between two layers of metal wiring as taught in the present invention.

A second layer of dielectric such as, but not limited to, a second layer of SOG is now deposited over the structure seen in FIG. 5, creating IMD 9. As illustrated in FIG. 6, IMD 9 is sandwiched between silicon oxide layers 21 and 22 which were deposited by means of plasma enhanced chemical vapor deposition. Optionally, layer 21 may be omitted. The thickness of layer 9 is between about 15,000 and 18,000 Angstrom units. Via holes, such as 11, are etched, where required, through layer 9 down to the level of layer 3 and metallic layer 10 is deposited on the surface of layer 9, making low resistance contact with 3 at the bottoms of the via holes. Finally, layer 10 is patterned into conductive lines as required by the demands of the circuits under formation.

Although the process of the present invention requires an additional step relative to the previously practiced process, the substantial reduction in the time needed to remove the titanium nitride layer more than compensates for said extra step. On average, the time between going from a structure at the stage of FIG. 1 to a structure at the stage of FIG. 2 is about 48 hours whereas the time to go from a structure at the stage of FIG. 1 to a structure at the stage of FIG. 6 is about 52 hours. In addition, problems such as high via hole contact resistance and low via hole yield, that are associated with the formation of a polymer layer on the side walls of the via holes, do not arise when the process of the present invention is used.

While the invention has been particularly shown and described with reference to the above preferred embodiment, it will be understood by those skilled in the art that various changes in form and details may be made without departing from the spirit and scope of the invention.

What is claimed is:

1. A process for removing a first layer of titanium nitride, said first layer of titanium nitride covering a metal layer which covers a second layer of titanium nitride, within an integrated circuit, comprising:

depositing a layer of a spin-on glass over said first titanium nitride layer to a thickness greater than that of said first titanium nitride layer and of all layers that underlie it;

etching back said layer of spin-on glass for long enough for the first titanium nitride layer to become fully exposed, while still leaving said layer of spin-on-glass in place to prevent any undercutting of the second titanium nitride layer; and removing said first layer of titanium nitride in a manner such that said metal layer underlying it is exposed and not removed.

2. The process of claim 1 wherein said layer of titanium nitride serves the function of an anti-reflective coating.

3. The process of claim 1 wherein said spin-on glass is Allied Signal Siloxane type 211.

4. The process of claim 1 wherein the layer immediately underlying said layer of titanium nitride comprises aluminum or titanium.

5. The process of claim 1 wherein the thickness of said layer of titanium nitride is between 200 and 500 Angstrom units.

6. The process of claim 1 wherein the removal of said layer of spin-on glass comprises etching in a mix of $CF_4$ and $CHF_3$ gases in argon for between 0.3 and 1 minutes at a temperature between 0° and 30° C. and a pressure between 200 and 400 torr.

7. The process of claim 1 wherein the removal of said layer of titanium nitride comprises etching in a mix of carbon tetrafluoride, oxygen, and nitrogen for between 0.3 and 0.5 minutes at a temperature between 250° and 450° C. and a pressure between 1.5 and 4 torr.

8. A process for forming an inter-metal dielectric layer over, and then making electrical contact to, an aluminum layer, within an integrated circuit, which has been previously over and under coated with first and second layers respectively of titanium nitride, comprising:

depositing a layer of spin-on glass over said integrated circuit;

etching said layer of spin-on glass for long enough for the first titanium nitride layer to become fully exposed, while still leaving said layer of spin-on-glass in place to prevent any undercutting of said second layer of titanium nitride;

removing said first layer of titanium nitride;

coating said integrated circuit with a layer of dielectric material to a thickness sufficient to cover the surface of the integrated circuit;

etching via holes through said layer of dielectric material wherever electrical contact with said aluminum layer is required;

forming a conductive layer on said dielectric layer, including the bottoms and sides of said via holes; and patterning said conductive layer to provide electrical connections to other parts of the integrated circuit.

9. The process of claim 8 wherein said layer of titanium nitride serves the function of an anti-reflective coating.

10. The process of claim 8 wherein the thickness of said layer of titanium nitride is between 200 and 500 Angstrom units.

11. The process of claim 8 wherein the removal of said layer of spin-on glass comprises etching in a mixture of $CF_4$ and $CHF_3$ gases in argon for between 0.3 and 1 minutes at a temperature between 0° and 30° C. and a pressure between 200 and 400 torr.

12. The process of claim 8 wherein the removal of said layer of titanium nitride comprises etching in a mix of carbon tetrafluoride, oxygen, and nitrogen for between 0.3 and 0.5 minutes at a temperature between 250° and 450° C. and a pressure between 1.5 and 4 torr.

13. The process of claim 8 wherein said layer of spin-on glass comprises Allied Signal Siloxane type 211 SOG formed by spin coating followed by baking and curing in nitrogen.

14. The process of claim 8 wherein the thickness of said layer of spin-on glass and said dielectric layer total between 15,000 and 18,000 Angstrom units.

15. The process of claim 8 wherein said dielectric layer comprises a second layer of spin-on glass.

16. The process of claim 1 wherein the thickness of said layer of aluminum is between 4,000 and 6,000 Angstrom units.

* * * * *